US011908724B2

(12) United States Patent
Potter et al.

(10) Patent No.: US 11,908,724 B2
(45) Date of Patent: Feb. 20, 2024

(54) METHOD AND APPARATUS FOR MEASURING PLACEMENT OF A SUBSTRATE ON A HEATER PEDESTAL

(71) Applicant: Applied Materials, Inc., Santa Clara, CA (US)

(72) Inventors: Charles G. Potter, Santa Clara, CA (US); Anthony D. Vaughan, Ben Lomond, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/845,816

(22) Filed: Jun. 21, 2022

(65) Prior Publication Data

US 2022/0319887 A1 Oct. 6, 2022

Related U.S. Application Data

(62) Division of application No. 16/545,824, filed on Aug. 20, 2019, now Pat. No. 11,404,296.

(Continued)

(51) Int. Cl.
*H01L 21/67* (2006.01)
*H01L 21/68* (2006.01)
(Continued)

(52) U.S. Cl.
CPC .......... *H01L 21/681* (2013.01); *B25J 9/1692* (2013.01); *B25J 13/086* (2013.01); *G01D 5/24* (2013.01);
(Continued)

(58) Field of Classification Search
CPC .. G01D 5/24; G01D 5/2412; H01L 21/68707; H01L 21/67103; H01L 21/67265;
(Continued)

(56) References Cited

U.S. PATENT DOCUMENTS 6,499,367 B1 12/2002 Saeki
7,778,793 B2 8/2010 Bonciolini et al.
(Continued)

FOREIGN PATENT DOCUMENTS

CN 1786833 A 6/2006
CN 101517701 A 8/2009
(Continued)

OTHER PUBLICATIONS

Notice of Reasons for Rejection from Japanese Patent Application No. 2021-503160 dated Oct. 12, 2022, 3 pgs.
(Continued)

*Primary Examiner* — Jarrett J Stark
(74) *Attorney, Agent, or Firm* — Schwabe, Williamson & Wyatt, P.C.

(57) ABSTRACT

Embodiments disclosed herein include a method of determining the position of a sensor wafer relative to a pedestal. In an embodiment, the method comprises placing a sensor wafer onto the pedestal, wherein the sensor wafer comprises a first surface that is supported by the pedestal, a second surface opposite the first surface, and an edge surface connecting the first surface to the second surface, wherein a plurality of sensor regions are formed on the edge surface, and wherein the pedestal comprises a major surface and an annular wall surrounding the sensor wafer. In an embodiment, the method further comprises determining a gap distance between each of the plurality of sensor regions and the annular wall. In an embodiment, the method may further comprise determining a center-point offset of a center-point of the sensor wafer relative to a center point of the annular wall from the gap distances.

7 Claims, 7 Drawing Sheets

Related U.S. Application Data

(60) Provisional application No. 62/726,887, filed on Sep. 4, 2018.

(51) Int. Cl.
    *G01D 5/24* (2006.01)
    *H01L 21/687* (2006.01)
    *B25J 13/08* (2006.01)
    *B25J 9/16* (2006.01)

(52) U.S. Cl.
     CPC .. *H01L 21/67103* (2013.01); *H01L 21/67259* (2013.01); *H01L 21/68707* (2013.01)

(58) Field of Classification Search
     CPC ........... H01L 21/6831; H01L 21/67259; H01L 21/68735; H01L 21/68; H01L 21/6833; H01L 21/67745; B25J 13/086; G01B 7/14; H01J 37/3264
     See application file for complete search history.

(56) References Cited

U.S. PATENT DOCUMENTS

| | | | |
|---|---|---|---|
| 7,804,306 | B2 | 9/2010 | Gardner et al. |
| 9,903,739 | B2 | 2/2018 | Sugita et al. |
| 10,794,681 | B2 * | 10/2020 | Potter ............... G01B 7/003 |
| 10,847,393 | B2 * | 11/2020 | Potter ............... G01B 7/08 |
| 10,903,100 | B2 * | 1/2021 | Sugita ............... G01D 5/2412 |
| 2007/0046284 | A1 | 3/2007 | Renken et al. |
| 2007/0222462 | A1 | 9/2007 | Gardner et al. |
| 2008/0236492 | A1 * | 10/2008 | Yamazawa ......... H01J 37/32183 118/723 I |
| 2008/0239314 | A1 | 10/2008 | Bonciolini et al. |
| 2008/0246493 | A1 | 10/2008 | Gardner |
| 2011/0074341 | A1 | 3/2011 | Jensen et al. |
| 2011/0193573 | A1 | 8/2011 | DeBoer et al. |
| 2012/0050740 | A1 * | 3/2012 | Hoogendam ......... G01B 11/14 356/401 |
| 2012/0304928 | A1 | 12/2012 | Koelmel et al. |
| 2013/0029433 | A1 * | 1/2013 | Sun ............... G03F 7/70875 257/E21.528 |
| 2015/0050118 | A1 | 2/2015 | Sorabji et al. |
| 2015/0369583 | A1 * | 12/2015 | Potter, Sr. ......... H01L 21/67259 702/150 |
| 2016/0141154 | A1 * | 5/2016 | Kamata ............... G01B 7/023 324/671 |
| 2016/0211166 | A1 * | 7/2016 | Yan ................. H01J 37/20 |
| 2016/0220172 | A1 | 8/2016 | Sarrafzadeh et al. |
| 2016/0363433 | A1 * | 12/2016 | Sugita ............... G01R 27/2605 |
| 2017/0131217 | A1 | 5/2017 | Tedeschi et al. |
| 2018/0114681 | A1 * | 4/2018 | Jensen ............. H01J 37/32935 |
| 2018/0240694 | A1 * | 8/2018 | Adderly ............... G01S 15/42 |
| 2020/0103294 | A1 * | 4/2020 | Potter ............... G01L 1/16 |

FOREIGN PATENT DOCUMENTS

| | | |
|---|---|---|
| CN | 102210017 A | 11/2011 |
| CN | 103208449 A | 7/2013 |
| EP | 1669808 | 6/2007 |
| JP | 2004/279081 | 10/2004 |
| JP | 2006/173607 | 6/2006 |
| JP | 2011144091 A | 7/2011 |
| JP | 4956328 | 6/2012 |
| JP | 4956328 B2 * | 6/2012 | .......... G03F 7/7075 |
| JP | 2013229367 A | 11/2013 |
| JP | 2017/003557 | 1/2017 |
| JP | 2017069414 A | 4/2017 |
| JP | 2017-228754 | 12/2017 |
| KR | 10-2006-0065559 | 6/2006 |
| KR | 10-2014-0136533 | 11/2014 |
| KR | 10-2016-0146574 | 12/2016 |
| KR | 10-2017-0014384 | 2/2017 |
| KR | 101841607 | 3/2018 |

OTHER PUBLICATIONS

International Search Report and Written Opinion from PCT/US2019/044755 dated Nov. 20, 2019, 13 pgs.
International Search Report and Written Opinion from PCT/US2019/047535 dated Dec. 10, 2019, 10 pgs.
International Search Report and Written Opinion from PCT/US2019/047752 dated Dec. 10, 2019, 12 pgs.
International Search Report and Written Opinion from PCT/US2019/047983 dated Dec. 13, 2019, 12 pgs.
International Search Report and the Written Opinion from PCT/US2019/044524 dated Dec. 20, 2019, 10 pgs.
Official Letter from Taiwan Patent Application No. 108130362 dated Feb. 6, 2020, 12 pgs.
Office Action from Taiwan Patent Application No. 108130362 dated Aug. 7, 2020, 11 pgs.
International Preliminary Report on Patentability from Patent Application No. PCT/US2019/047752 dated Mar. 18, 2021, 8 pgs.
Official Letter from Taiwan Patent Application No. 108130362 dated Feb. 24, 2020, 18 pgs.
Official Letter from Taiwan Patent Application No. 108130362 dated Sep. 8, 2020,17 pgs.
Official Letter from Taiwan Patent Application No. 108130362 dated Jul. 26, 2021, 9 pgs.
Non-Final Office Action from U.S. Appl. No. 16/545,824 dated Jul. 30, 2021, 25 pgs.
Final Office Action from U.S. Appl. No. 16/545,824 dated Nov. 2, 2021, 15 pgs.
Official Letter from Taiwan Patent Application No. 108130362 dated Dec. 7, 2021, 9 pgs.
Notice of Reasons for Rejection from Japanese Patent Application No. 2021-503160 dated Apr. 13, 2022, 10 pgs.
Preliminary Rejection from Korean Patent Application No. 10-2021-7002652 dated May 2, 2022, 7 pgs.
Official Letter from Taiwan Patent Application No. 109134766 dated Jun. 10, 2022, 9 pgs.
First Office Action from Chinese Patent Application No. 201980048663.1 dated Aug. 3, 2023, 11 pgs.
Preliminary Objection from Korean Patent Application No. 10-2022-7038977 dated Jul. 11, 2023, 6 pgs.

* cited by examiner

METHOD AND APPARATUS FOR MEASURING PLACEMENT OF A SUBSTRATE ON A HEATER PEDESTAL

CROSS REFERENCE TO RELATED APPLICATIONS

This application is a divisional of U.S. patent application Ser. No. 16/545,824 filed on Aug. 20, 2019, which claims priority to U.S. Provisional Application No. 62/726,887, filed on Sep. 4, 2018, the entire contents of which are hereby incorporated by reference herein.

BACKGROUND

1) Field

Embodiments relate to the field of semiconductor manufacturing and, in particular, to methods and apparatuses for centering wafers on a heating pedestal.

2) Description of Related Art

In the processing of substrates, such as semiconducting wafers, a substrate may be placed on a heating pedestal for various manufacturing operations. Typically, the heating pedestal comprises a flat surface on which the substrate rests and an annular ring (also referred to as a pocket) that surrounds the substrate. The annular ring is generally thicker than the substrate being processed.

Ideally, the substrate should be centered with the annular ring in order to provide uniform processing across the substrate. That is, a center-point of the substrate should coincide with a center-point of the annular ring. Currently, the alignment of the substrate to the annular ring is made by eye, which does not provide the accuracy needed to assure uniform processing. In order to confirm that the substrate placement is suitable, on-wafer uniformity tests may be run. Such tests require hours to perform and are costly due to the expense of test wafers.

SUMMARY

Embodiments disclosed herein include a method of determining the position of a sensor wafer relative to a pedestal. In an embodiment, the method comprises placing a sensor wafer onto the pedestal, wherein the sensor wafer comprises a first surface that is supported by the pedestal, a second surface opposite the first surface, and an edge surface connecting the first surface to the second surface, wherein a plurality of sensor regions are formed on the edge surface, and wherein the pedestal comprises a major surface and an annular wall surrounding the sensor wafer. In an embodiment, the method further comprises determining a gap distance between each of the plurality of sensor regions and the annular wall. In an embodiment, the method may further comprise determining a center-point offset of a center-point of the sensor wafer relative to a center point of the annular wall from the gap distances.

Embodiments disclosed herein include a placement controller. In an embodiment, the placement controller comprises a sensor interface, wherein the sensor interface receives sensor information from a sensor wafer comprising a plurality of outward facing sensors along an edge surface of the sensor wafer. In an embodiment, the placement controller further comprises a center-point module, wherein the center-point module utilizes the sensor information to determine a center-point of the sensor wafer relative to a center-point of a heating pedestal on which the sensor wafer rests, and wherein the placement controller controls a positioning robot that places the sensor wafer on the pedestal.

Embodiments disclosed herein comprise a method of calibrating a wafer positioning robot for placing a wafer onto a pedestal. In an embodiment, the method comprises placing a sensor wafer in a first position on the pedestal with the wafer positioning robot, wherein the sensor wafer comprises a first surface that is supported by the pedestal, a second surface opposite the first surface, and an edge surface connecting the first surface to the second surface, wherein a plurality of sensor regions are formed on the edge surface, and wherein the pedestal comprises a major surface and an annular wall surrounding the sensor wafer. In an embodiment, the method further comprises determining a gap distance between each of the plurality of sensor regions and the annular wall. In an embodiment, the method further comprises determining a center-point offset of a center-point of the sensor wafer relative to a center point of the annular wall from the gap distances. In an embodiment, the method further comprises generating a second position by modifying the first position by the center-point offset. In an embodiment, the method further comprises removing the sensor wafer from the pedestal with the wafer positioning robot. In an embodiment, the method further comprises placing a wafer in the second position on the pedestal with the wafer positioning robot.

DETAILED DESCRIPTION

Systems that include sensor wafers with edge sensors and methods of using such sensor wafers to measure the offset of the sensor wafer relative to a pedestal are described in accordance with various embodiments. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

As noted above, the alignment of wafers on a heater pedestal is currently confirmed by eye. Only after many tests wafers are processed will it be possible to confirm that the process kit is properly centered with respect to the annular ring of the pedestal. This process requires hours of down time for the processing tool and is expensive.

Accordingly, embodiments disclosed herein include a sensor wafer that is capable of measuring the offset of the sensor wafer with respect to the pedestal directly. As such, a single test procedure may be implemented to confirm that the sensor wafer is centered within a desired tolerance. If the sensor wafer placement is found to be outside of the desired tolerance, then the positioning robot used to place the sensor wafer on the pedestal may be provided with an offset that allows for subsequently placed wafers to be properly aligned without the need for extensive testing. Therefore, embodiments disclosed herein provide reduced down time of processing tools and improves the uniformity of processes implemented by the processing tool since the centering accuracy of the wafers can be improved.

Figure 1A:
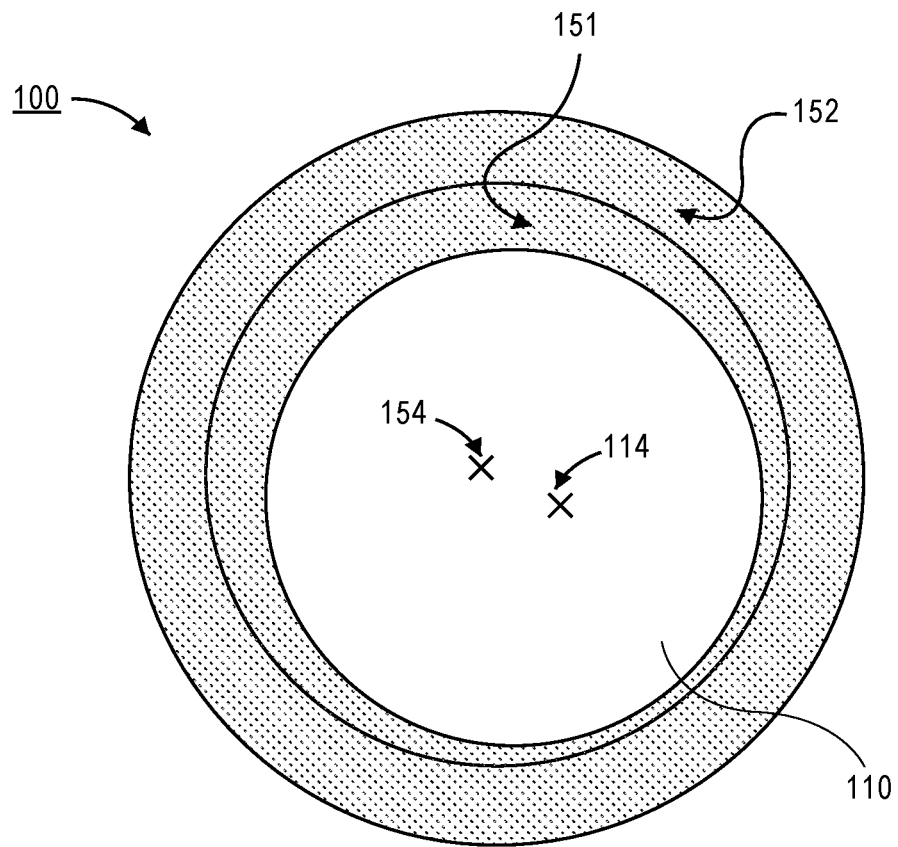
FIG. 1A is a plan view illustration of a sensor wafer on a heating pedestal, in accordance with an embodiment.

Referring now to FIG. 1A, a plan view illustration of a sensor wafer 110 that is supported on a pedestal 100 is shown, in accordance with an embodiment. In an embodiment, the pedestal 100 may be any surface on which wafers are placed for processing. For example, the pedestal 100 may be a heating pedestal. In an embodiment, the pedestal 100 may comprise a major surface 151 on which wafers are placed and an annular ring 152 that surrounds the wafer.

In an embodiment, the sensor wafer 110 may comprise a plurality of outward facing sensors that are used to determine an offset of the sensor wafer 110 with respect to the pedestal 100. As shown in FIG. 1A, the diameter of the sensor wafer 110 may be less than an inner diameter of the annular ring 152. In an embodiment, the sensor wafer 110 may have substantially the same dimensions as a production wafer. For example, the sensor wafer 110 may have a diameter that is a standard wafer diameter (e.g., 300 mm or the like). Accordingly, it is possible for the sensor wafer 110 to be misaligned with the annular ring 152. For example, center-point 114 of the sensor wafer 110 may not be coincident with center-point 154 of the annular ring 152.

Figure 1B:
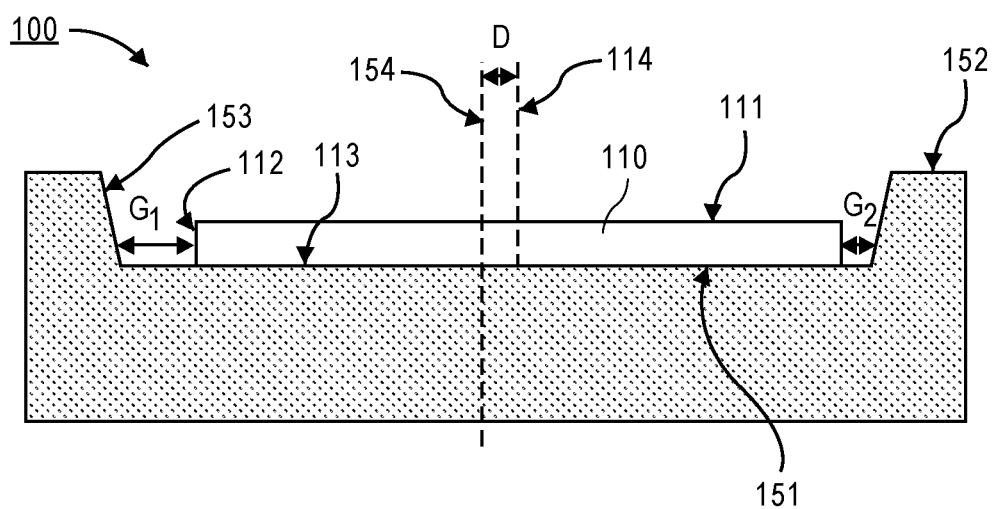
FIG. 1B is a cross-sectional illustration of the sensor wafer and the heating pedestal in FIG. 1A, in accordance with an embodiment.

Referring now to FIG. 1B, a cross-sectional illustration of the pedestal 100 and the sensor wafer 110 is shown in order to more clearly illustrate the misalignment of the sensor wafer 110. As illustrated, a first (i.e., bottom) surface 113 of the sensor wafer 110 rests on the major surface 151 of the pedestal 100. The annular ring 152 encircles the sensor wafer 110 so that an interior surface 153 of the annular ring faces an edge surface 112 of the sensor wafer 110. In an embodiment, the height of the interior surface 153 may be greater than the thickness of the sensor wafer 110. That is, a second (i.e., top) surface 111 of the sensor wafer 110 may be below a top surface of the annular ring 152.

As shown in FIG. 1B, the interior surface 153 of the annular ring 152 is spaced away from the edge surface 112 of the sensor wafer by a first gap $G_1$ and a second gap $G_2$. When the first gap $G_1$ and the second gap $G_2$ are not equal, the sensor wafer 110 is misaligned. For example, the center-point 114 of the sensor wafer 110 is offset from the center-point 154 of the annular ring 152 by a distance D.

In an embodiment, the offset distance D may be determined by measuring the gap G between the edge 112 of the sensor wafer 110 and the interior surface 153 of the annular ring 152 in a plurality of locations. In a particular embodiment, the gap G is measured with a plurality of sensor regions formed on the edges of the sensor wafer 110. FIGS. 2-4C provide exemplary illustrations of sensor wafers 110 with edge sensor regions, in accordance with various embodiments.

Figure 2:
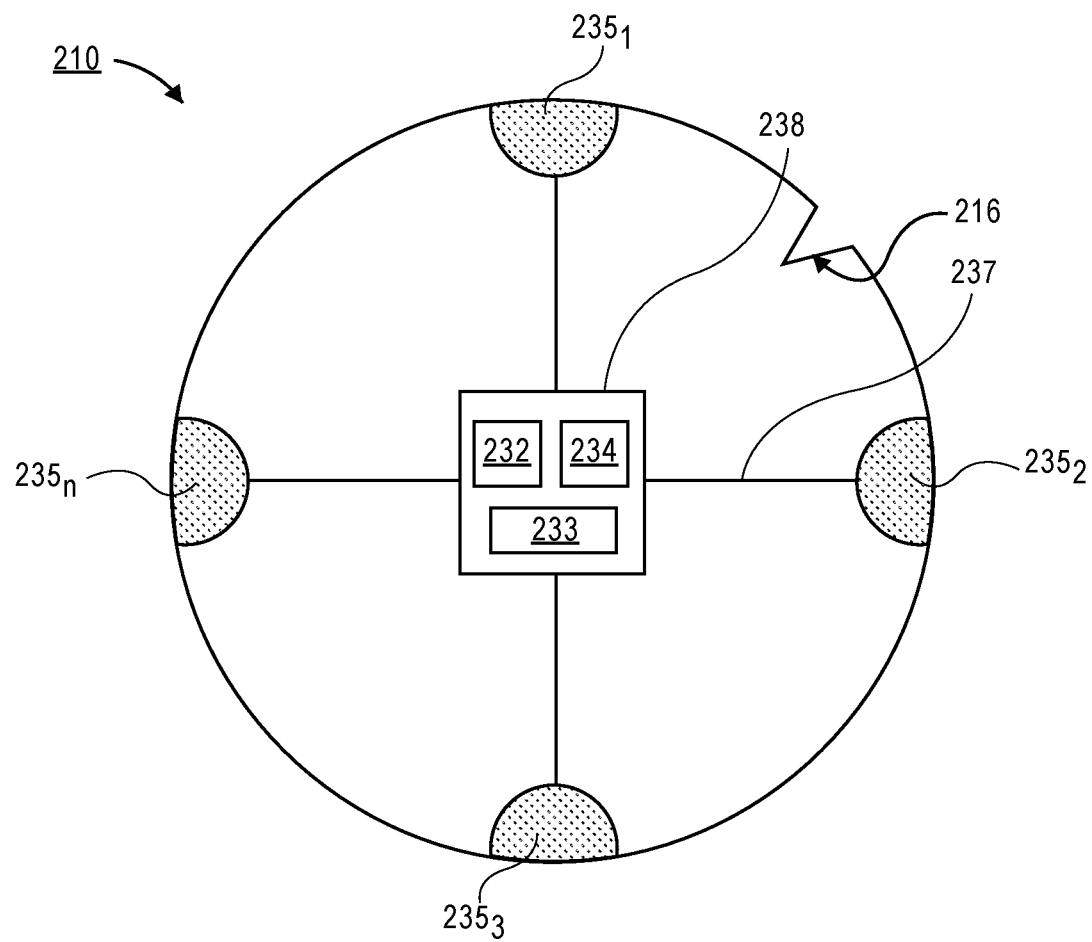
FIG. 2 is a plan view illustration of a sensor wafer with edge sensors, in accordance with an embodiment.

Referring now to FIG. 2, a plan view illustration of a sensor wafer 210 with a plurality of edge sensor regions $235_1$-$235_n$ is shown, in accordance with an embodiment. In an embodiment, the edge sensor regions 235 are distributed around the perimeter of the sensor wafer 210. Each sensor region 235 comprises one or more sensors that are used to measure the gap between the edge of the sensor wafer 210 and the annular ring of the pedestal that encircles the sensor wafer 210. The one or more sensors in the edge sensor regions 235 may be capacitive sensors. In a particular embodiment, the edge sensor regions 235 may comprise self-referencing capacitive sensors.

In the illustrated embodiment, four edge sensor regions 235 positioned at 90 degree intervals are shown. However, it is to be appreciated that three or more edge sensor regions 235 may be used to measure the offset of the center of the process kit relative to the center of the sensor wafer 210. Those skilled in the art will recognize that providing more edge sensor regions 235 will provide more accurate measurements. In an embodiment, the sensor wafer 210 may also comprise a notch 216. The position of the notch 216 relative to the sensor regions 235 may be known by the sensor wafer 210. Accordingly, a rotational orientation of the sensor wafer 210 may be determined as well.

In an embodiment, each of the edge sensor regions 235 may be communicatively coupled to a computing module 238 on the sensor wafer 210 with traces 237. In an embodiment, the computing module 238 may comprise one or more of a power source 232 (e.g., a battery), a processor/memory 234 (e.g., circuitry, memory, etc. for implementing and/or storing measurements made with the edge sensor regions 235), and a wireless communication module 233 (e.g., Bluetooth, WiFi, etc.). In an embodiment, computing module 238 may be embedded in the sensor wafer 210. Additionally, while shown in the center of the sensor wafer 210, it is to be appreciated that the computing module 238 may be located at any convenient location in the sensor wafer 210.

Figure 3:
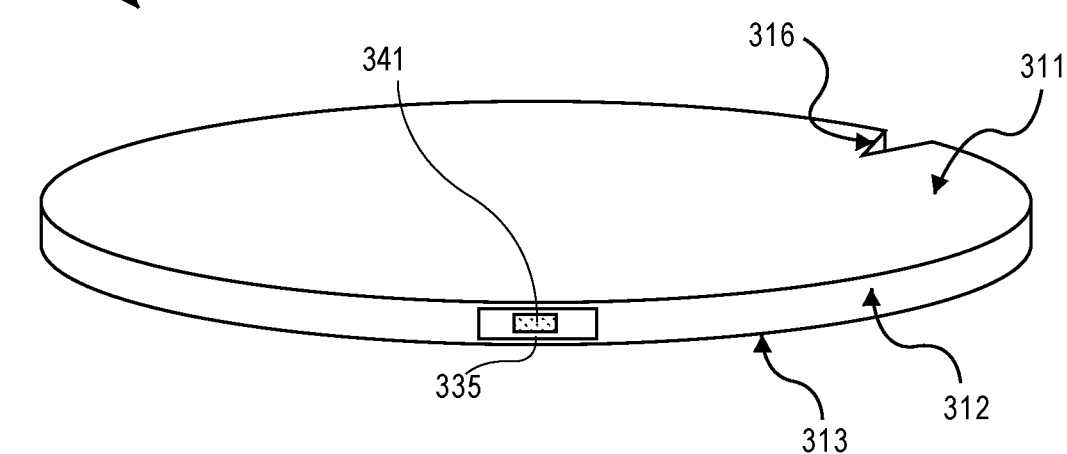
FIG. 3 is a perspective view illustration of a sensor wafer with edge sensors, in accordance with an embodiment.

Referring now to FIG. 3, a perspective view illustration of a sensor wafer 310 that highlights the details of an exemplary edge sensor region 335 is shown, in accordance with an embodiment. In an embodiment, the sensor wafer 310 may comprise a first surface 313 (e.g., a bottom surface), a second surface 311 (e.g., a top surface), and an edge surface 312 that connects the first surface 313 to the second surface 311. In an embodiment, a notch 316 may be formed into the sensor wafer 310.

In an embodiment, edge sensor regions 335 may be formed along the edge surface 312 that connects the first surface 313 to the second surface 311. In a particular embodiment, each edge sensor region 315 may comprise a probe 341. The probes 341 (i.e., the probe in each edge sensor region) may be self-referencing capacitive probes. That is, an output phase of current supplied to the first probe 341 in a first edge sensor region 335 may be 180 degrees offset from an output phase of current supplied to the second probe 341 in a neighboring second edge sensor region 335. As such, a distance measurement from the edge surface 312 to the interior surface of the annular ring (not shown) may be made without the pedestal needing to be grounded. In the illustrated embodiment, the edge sensor region 335 is shown as having a single probe. However, in some embodiments, each edge sensor region 335 may comprise more than one probe 341. While particular reference is made herein to self-referencing capacitive sensors, it is to be appreciated that embodiments disclosed herein include any suitable sensor technology (e.g., laser sensors, optical sensors, etc.).

Figure 4A:
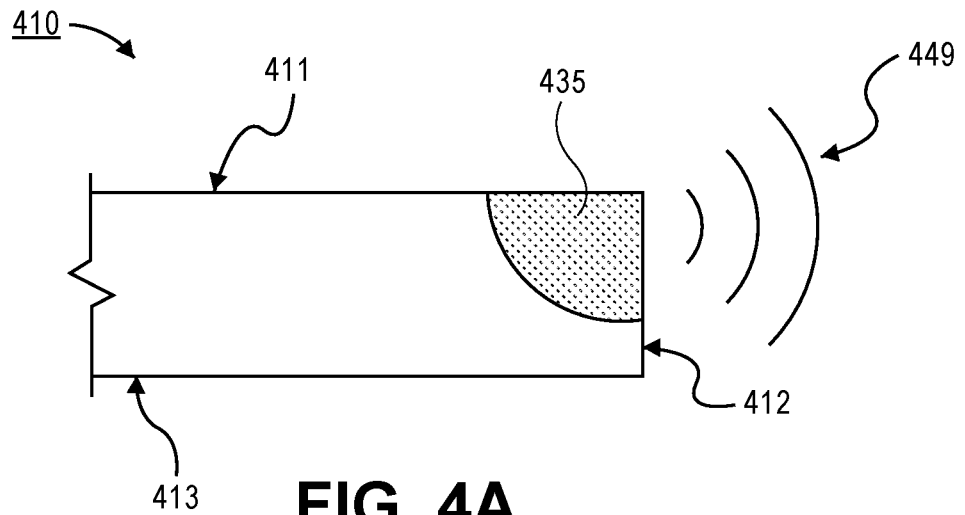
FIG. 4A is a partial cross-sectional illustration of a sensor wafer with an edge sensor, in accordance with an embodiment.
Figure 4B:
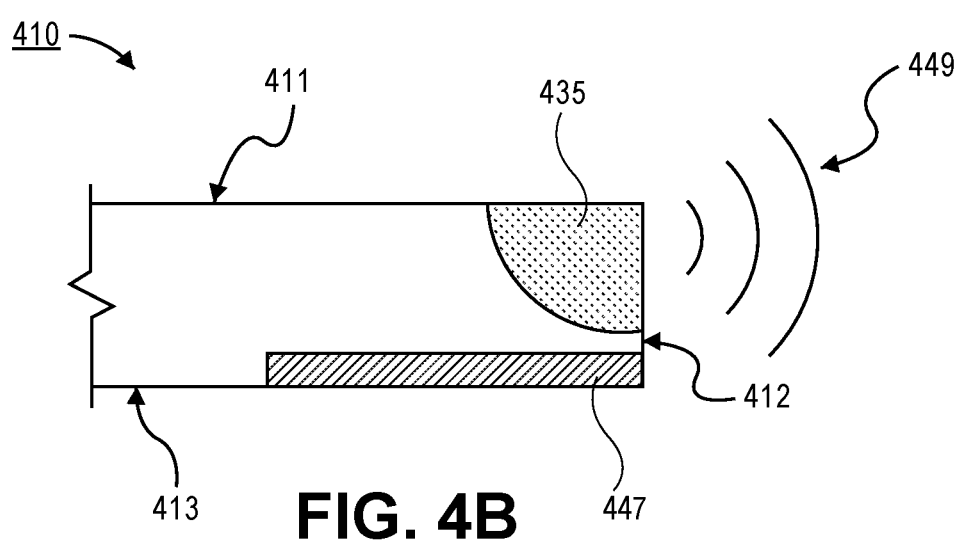
FIG. 4B is a partial cross-sectional illustration of a sensor wafer with an edge sensor and an electric field guard, in accordance with an embodiment.
Figure 4C:
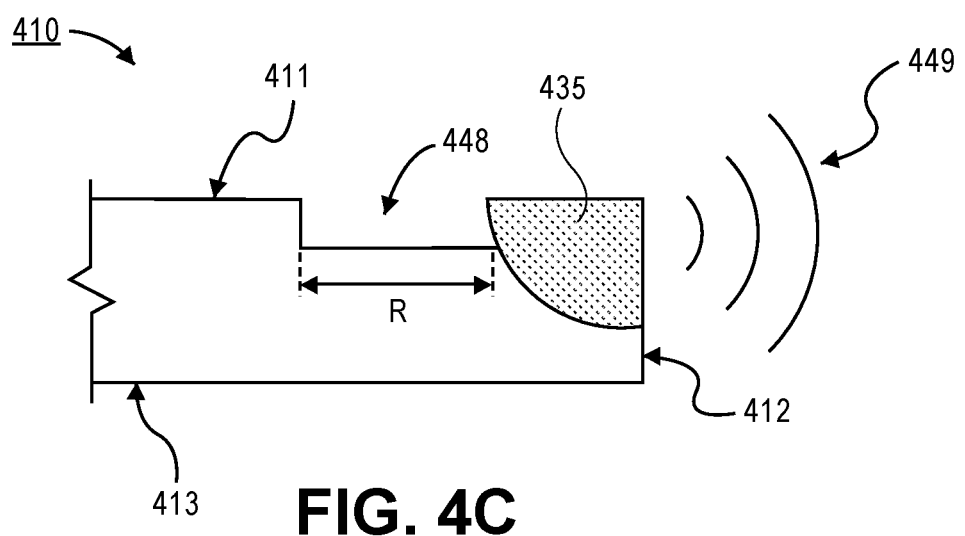
FIG. 4C is a partial cross-sectional illustration of a sensor wafer with an edge sensor and a top surface recess, in accordance with an embodiment.

Referring now to FIGS. 4A-4C, exemplary partial cross-sectional illustrations of sensor wafers 410 are shown, in accordance with various embodiments. In FIG. 4A, a partial cross-sectional illustration depicts the sensor region 435 being substantially coplanar with the edge surface 412. In an embodiment, the sensor region 435 emits an electric field 449 from the edge surface 412 so that the sensors may measure a gap between the edge surface 412 and a surface of the process kit.

Referring now to FIG. 4B, a partial cross-sectional illustration of a sensor wafer 410 with a an electric field guard 447 is shown, in accordance with an embodiment. In an embodiment, the electric field guard 447 may be a conductive layer that is formed between a bottom surface 413 of the sensor wafer 410 and the edge sensor region 435. The electric field 449 of the edge sensor region 435 may be modified by the electric field guard 447. Particularly, the electric field guard 447 may modify the electric field 449 of the edge sensor region 435 so that it extends laterally out from the edge surface 412 towards the interior surface of the annular ring. Accordingly, the electric field guard 447 prevents the sensors in the edge sensor region 435 from detecting the major surface of the pedestal on which the sensor wafer 410 is supported, and erroneous readings are eliminated.

Referring now to FIG. 4C, a partial cross-sectional illustration of a sensor wafer 410 with a top surface recess 448 is shown, in accordance with an embodiment. In an embodiment, the top surface recess 448 may be formed into the second surface 411 immediately adjacent to the sensor region 435. The top surface recess 448 may be made to prevent the sensors of the sensor region 435 from sensing the top surface 411 and providing erroneous readings. In an embodiment, the top surface recess 448 may extend back a distance R. For example the distance R may be approximately equal to a maximum sensing distance of the edge sensing region 435. For example, R may be approximately 5 mm or less.

Figure 5:
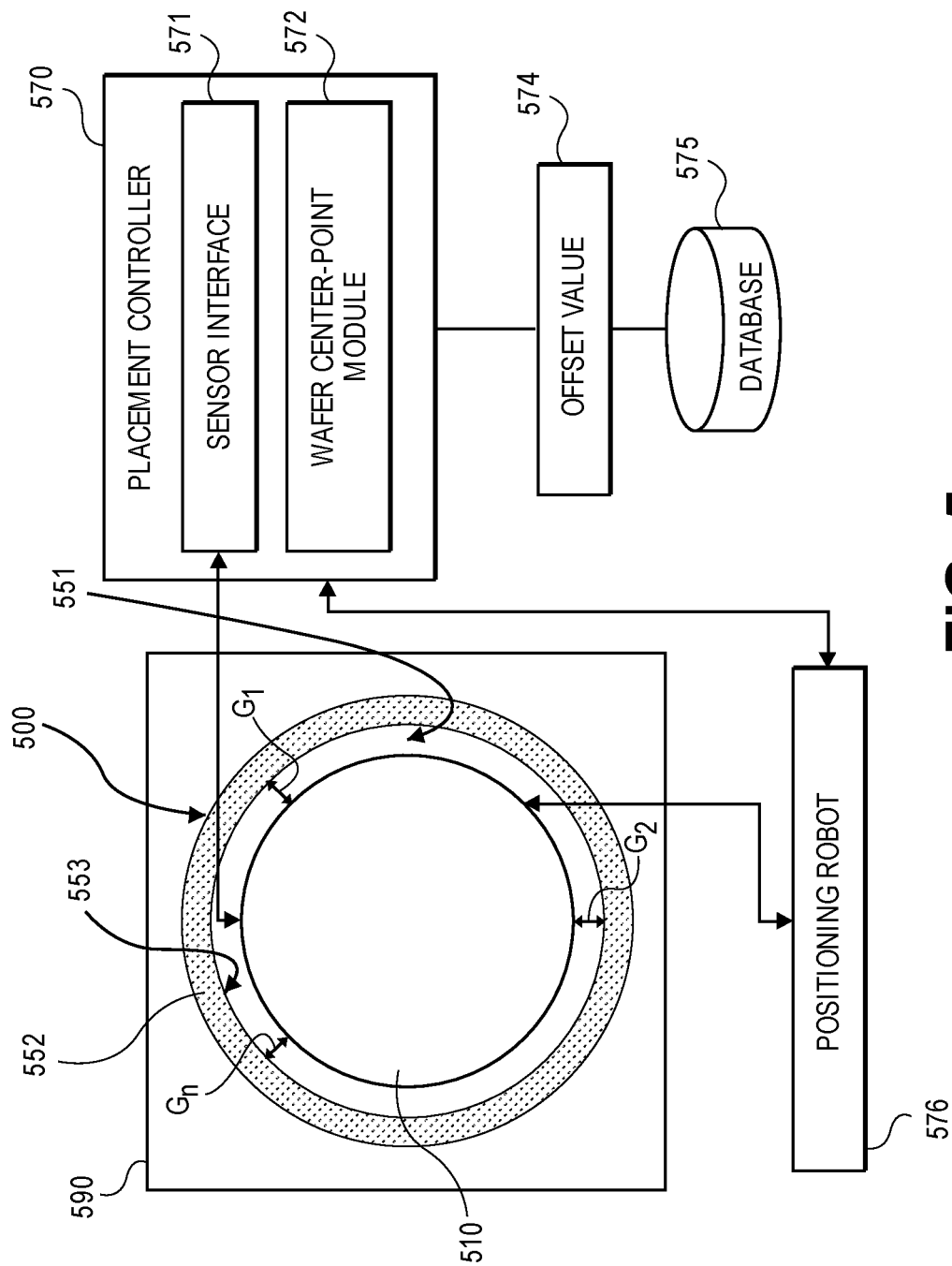
FIG. 5 is a schematic diagram of a processing tool and a placement controller for determining the offset of a sensor wafer relative to a pedestal, in accordance with an embodiment.

Referring now to FIG. 5, a schematic block diagram of a processing tool 590 with the a placement controller 570 for implementing a process to measure the offset of a sensor wafer on a pedestal is shown, in accordance with an embodiment. In an embodiment, a pedestal 500 may be located in the processing tool 590. The pedestal may comprise a major surface 551 on which a wafer is supported and an annular ring 552 that surrounds the wafer.

In an embodiment, the placement controller 570 may provide instructions to a positioning robot 576 to place a sensor wafer 510 on the major surface 551 of the pedestal 500. The sensor wafer 510 may be a sensor wafer similar to sensor wafers described above. For example, the sensor wafer 510 may comprise a plurality of edge sensor regions for measuring gaps $G_1$-$G_n$ between the edge of the sensor wafer 510 and the interior surface 553 of the annular ring 552.

In an embodiment, the sensor information from the sensor wafer 510 may be obtained by the sensor interface 571 of the placement controller 570. For example, the sensor interface 571 may receive sensor information from the sensor wafer 510 (e.g., wirelessly with a wireless communication module). The placement controller 570 may utilize sensor information (e.g., gaps $G_1$-$G_n$) in a wafer center-point module 572 to determine a center-point of the sensor wafer 510 relative to a center-point of the annular ring 552. The placement controller 570 may use the results from the wafer center-point module 572 to generate an offset value 574 that is delivered to a database 575. In an embodiment, when the total offset value 574 exceeds a predetermined threshold, the offset value 574 may be used by the placement controller 570 to modify where the positioning robot places substrates on the pedestal 500. In an embodiment, the threshold value may be an offset of +/−200 microns.

Figure 6:
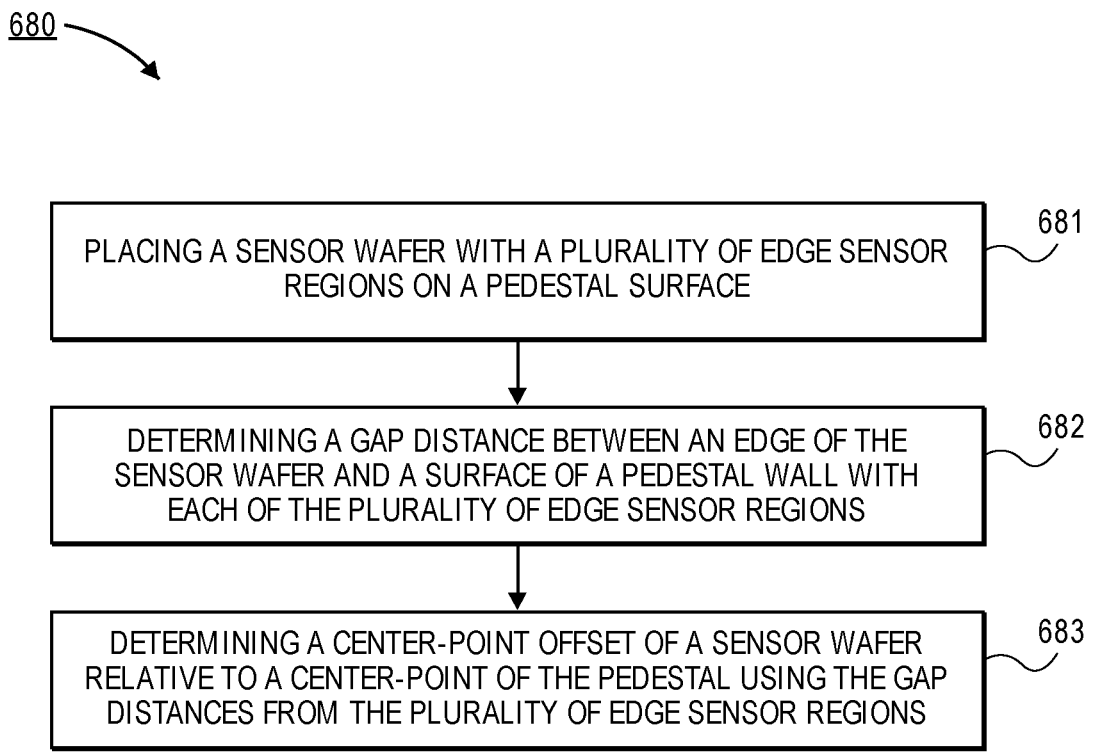
FIG. 6 is a flow diagram of a process for determining the offset of a sensor wafer relative to a pedestal, in accordance with an embodiment.
Figure 7:
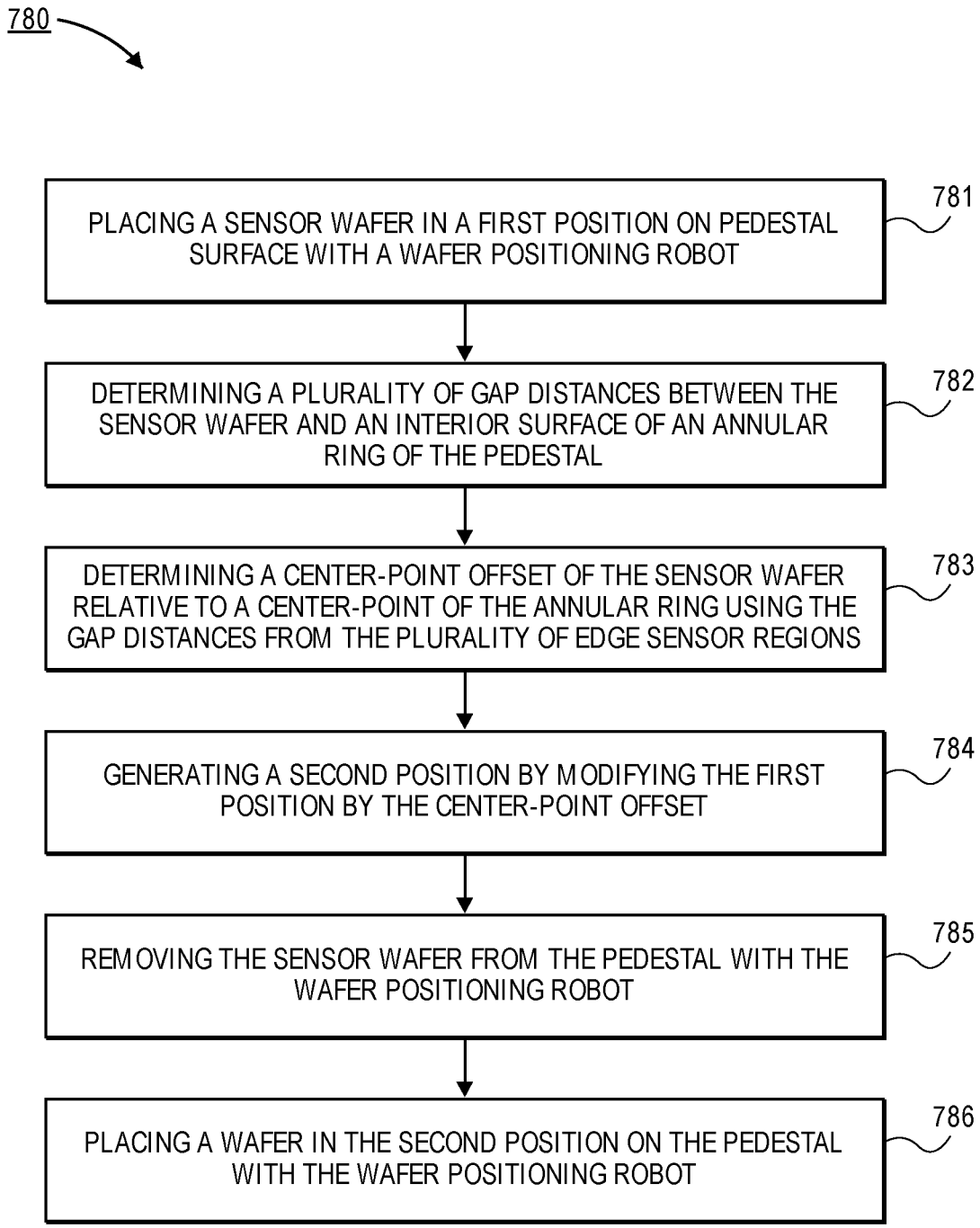
FIG. 7 is a flow diagram of a process for calibrating a wafer positioning robot with a sensor wafer, in accordance with an embodiment.

Referring now to FIG. 6, a process flow diagram of a process 680 for determining the center-point offset of a sensor wafer relative to the center-point of an annular ring of a pedestal is shown, in accordance with an embodiment.

In an embodiment, process 680 begins with operation 681 (e.g., performed by the positioning robot 576) which comprises placing a sensor wafer with a plurality of edge sensor regions on a pedestal. The sensor wafer may be any sensor wafer described in accordance with embodiments disclosed herein. In an embodiment, the sensor wafer may be placed on the support surface with a positioning robot controlled by a placement controller, similar to the embodiment described with respect to FIG. 5.

In an embodiment, process 680 may continue with operation 682 (e.g., performed by the sensor interface 571 of the placement controller 570) which comprises determining a gap distance between an edge of the sensor wafer and an interior surface of the annular ring of the pedestal with each of the plurality of edge sensor regions. For example, the edge sensor regions may comprise self-referencing capacitive sensors. The edge sensor regions may have electric field guards below them to modify the electric field of the capacitive sensors in order to prevent the capacitive sensor from reading the major surface on which the sensor wafer is supported. Additional embodiments may include a top surface recess proximate to the edge sensor regions to eliminate erroneous measurements of the top surface of the sensor wafer.

In an embodiment, process 680 may continue with operation 683 (e.g., performed by the wafer center-point module 572 of the placement controller 570) which comprises determining a center-point offset of the sensor wafer relative to a center-point of the annular ring using the gap distances from the plurality of edge sensor regions. In an embodiment, the center-point offset may be determined by a positioning controller and stored in a database.

Referring now to 7, a process flow diagram of a process 780 for calibrating a wafer positioning robot with a sensor wafer is shown, in accordance with an embodiment.

In an embodiment, process 780 may begin with operation 781 (e.g., performed by the positioning robot 576) which comprises placing a sensor wafer in a first position on a pedestal surface with a wafer positioning robot. In an embodiment, the sensor wafer may be any sensor wafer with outwards facing sensors, such as those described herein. In an embodiment, the pedestal may comprise a major surface on which the sensor wafer rests and an annular ring around the sensor wafer.

In an embodiment, process 780 may continue with operation 782 (e.g., performed by the sensor interface 571 of the placement controller 570) which comprises determining a plurality of gap distances between the sensor wafer and an interior surface of the annular ring of the pedestal with a plurality of edge sensor regions. For example, the edge sensor regions of the sensor wafer may comprise self-referencing capacitive sensors. The edge sensor regions may have electric field guards below them to modify the electric field of the capacitive sensors in order to prevent the capacitive sensors from reading the major surface on which the sensor wafer is supported. Additional embodiments may include top surface recess proximate to the edge sensor regions to eliminate erroneous measurements of the top surface of the sensor wafer.

In an embodiment, process 780 may continue with operation 783 (e.g., performed by the wafer center-point module 572 of the placement controller 570) which comprises determining a center-point offset of the sensor wafer relative to a center-point of the annular ring using the gap distances from the plurality of edge sensor regions.

In an embodiment, process 780 may continue with operation 784 (e.g., performed by the placement controller 570) which comprises generating a second position by modifying the first position by the center-point offset (e.g., an offset value 574). In an embodiment, operation 784 may be implemented to reduce the center-point offset of wafers subsequently placed onto the pedestal. In some embodiments, the second position is generated when the center-point offset exceeds a predetermined threshold. For example, if the center-point offset is less than 200 microns, then there may be no need to further calibrate the wafer positioning robot. In an embodiment, the offset value 574 may be stored in a database 575 for future use.

In an embodiment, process 780 may continue with operation 785 (e.g., performed by the positioning robot 576) which comprises removing the sensor wafer from the pedestal with the wafer positioning robot.

In an embodiment, process 780 may then continue with operation 786 (e.g., performed by the positioning robot 576) which comprises placing a wafer in the second position on the pedestal with the wafer positioning robot. In an embodiment, the wafer may be a production wafer (i.e., a wafer on which devices are manufactured). Since the wafer positioning robot has been calibrated, it can be presumed that the resulting placement of the wafer in the second position has a high degree of accuracy. For example, the subsequently placed device wafers may be placed with an accuracy that is +/−200 microns.

Figure 8:
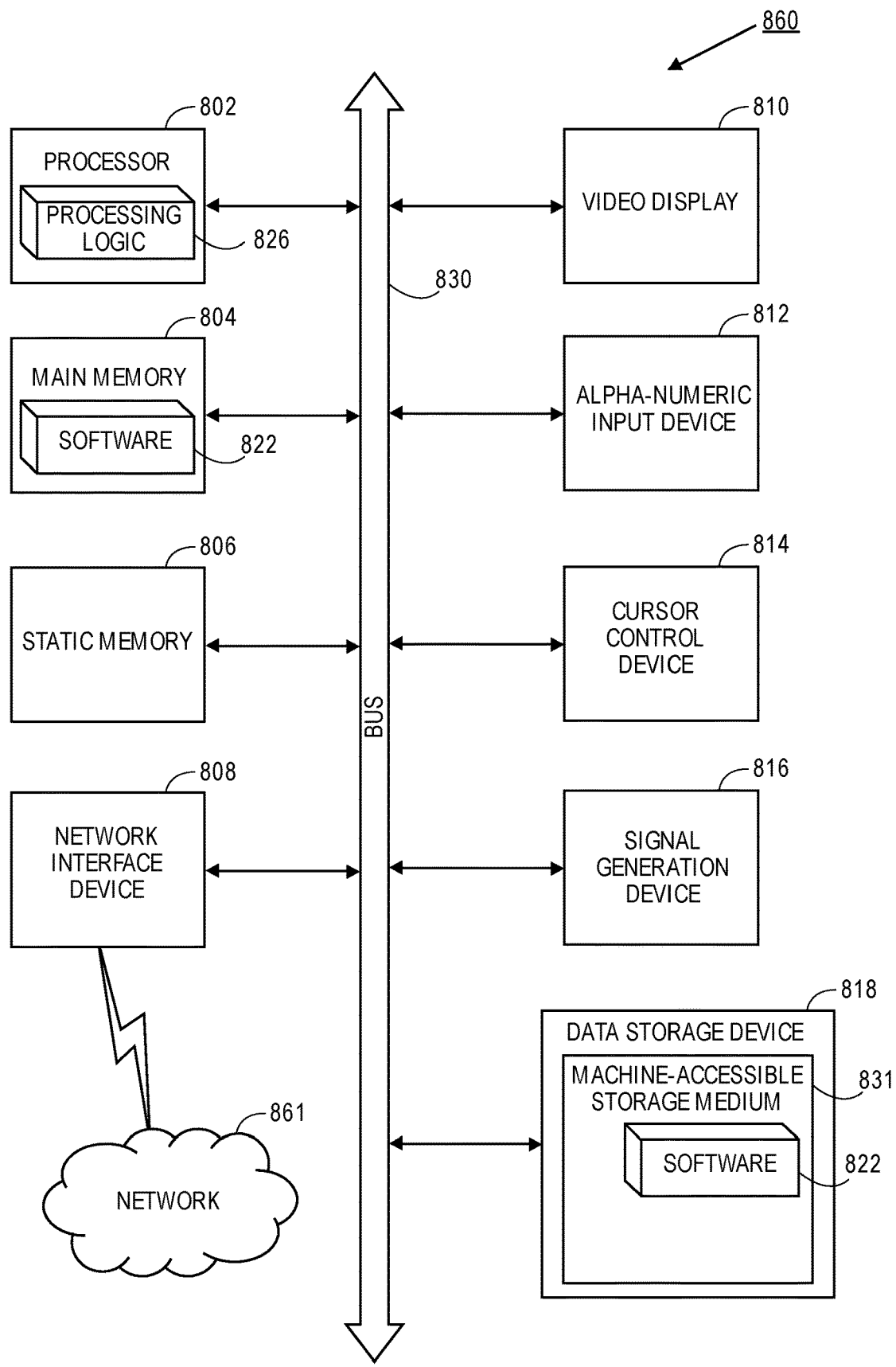
FIG. 8 illustrates a block diagram of an exemplary computer system that may be used in conjunction with processes that include determining the offset of a sensor wafer relative to a pedestal, in accordance with an embodiment.

Referring now to FIG. 8, a block diagram of an exemplary computer system 860 of a processing tool is illustrated in accordance with an embodiment. In an embodiment, the computer system 860 may be used as the placement controller. In an embodiment, computer system 860 is coupled to and controls processing in the processing tool. Computer system 860 may be connected (e.g., networked) to other machines in a network 861 (e.g., a Local Area Network (LAN), an intranet, an extranet, or the Internet). Computer system 860 may operate in the capacity of a server or a client machine in a client-server network environment, or as a peer machine in a peer-to-peer (or distributed) network environment. Computer system 860 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 860, the term "machine" shall also be taken to include any collection of machines (e.g., computers) that individually or jointly execute a set (or multiple sets) of instructions to perform any one or more of the methodologies described herein.

Computer system 860 may include a computer program product, or software 822, having a non-transitory machine-readable medium having stored thereon instructions, which may be used to program computer system 860 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 860 includes a system processor 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a secondary memory 818 (e.g., a data storage device), which communicate with each other via a bus 830.

System processor 802 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 802 may also be one or more special-purpose processing devices such as an application specific integrated circuit (ASIC), a field programmable gate array (FPGA), a digital signal system processor (DSP), network system processor, or the like. System processor 802 is configured to execute the processing logic 826 for performing the operations described herein.

The computer system 860 may further include a system network interface device 808 for communicating with other devices or machines. The computer system 860 may also include a video display unit 810 (e.g., a liquid crystal display (LCD), a light emitting diode display (LED), or a cathode ray tube (CRT)), an alphanumeric input device 812 (e.g., a keyboard), a cursor control device 814 (e.g., a mouse), and a signal generation device 816 (e.g., a speaker).

The secondary memory 818 may include a machine-accessible storage medium 831 (or more specifically a computer-readable storage medium) on which is stored one or more sets of instructions (e.g., software 822) embodying any one or more of the methodologies or functions described herein. The software 822 may also reside, completely or at least partially, within the main memory 804 and/or within the system processor 802 during execution thereof by the computer system 860, the main memory 804 and the system processor 802 also constituting machine-readable storage media. The software 822 may further be transmitted or received over a network 861 via the system network interface device 808.

While the machine-accessible storage medium 831 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A placement controller, comprising:
    a sensor interface, wherein the sensor interface is configured to receive sensor information from a sensor wafer, the sensor wafer comprising a plurality of outward facing sensors along an edge surface of the sensor wafer, and the sensor wafer comprising a plurality of discrete recesses, each recess radially between a corresponding one of the plurality of outward facing sensor regions and a center of the sensor wafer, and each recess exposing an inner lateral edge of the corresponding one of the plurality of outward facing sensor regions, wherein each of the plurality of recesses is non-continuous with one another; and
    a center-point module, wherein the center-point module is configured to utilizes the sensor information to determine a center-point of the sensor wafer relative to a center-point of a pedestal on which the sensor wafer rests, and wherein the placement controller is configured to control a positioning robot that places the sensor wafer on the pedestal.

2. The placement controller of claim 1, wherein the placement controller generates a position offset value that is stored in a database.

3. The placement controller of claim 2, wherein the position offset value is used to control the positioning robot as it places wafers on the pedestal.

4. The placement controller of claim 1, wherein the pedestal is a heater pedestal.

5. The placement controller of claim 1, wherein the sensors of the sensor wafer are self-referencing capacitive sensors.

6. The placement controller of claim 1, wherein the plurality of outward facing sensors comprises at least three outward facing sensors.

7. The placement controller of claim 1, wherein the controller is for determining a gap distance between each of the plurality of outward facing sensors and an annular wall.

* * * * *